(12) United States Patent
Nagashima

(10) Patent No.: US 12,738,324 B2
(45) **Date of Patent: *Sep. 15, 2026**

(54) MEMORY SYSTEM PERFORMING READ OPERATION USING READ VOLTAGE

(71) Applicant: Kioxia Corporation, Tokyo (JP)

(72) Inventor: Hiroyuki Nagashima, Yokohama (JP)

(73) Assignee: Kioxia Corporation, Tokyo (JP)

(*) Notice: Subject to any disclaimer, the term of this patent is extended or adjusted under 35 U.S.C. 154(b) by 8 days.

This patent is subject to a terminal disclaimer.

(21) Appl. No.: 18/654,302

(22) Filed: May 3, 2024

(65) Prior Publication Data

US 2024/0282389 A1 Aug. 22, 2024

Related U.S. Application Data

(63) Continuation of application No. 17/967,006, filed on Oct. 17, 2022, now Pat. No. 11,984,167, which is a (Continued)

(30) Foreign Application Priority Data

Nov. 6, 2009 (JP) ................................ 2009-255314

(51) Int. Cl.
*G11C 16/26* (2006.01)
*G06F 11/10* (2006.01)
(Continued)

(52) U.S. Cl.
CPC .......... *G11C 16/26* (2013.01); *G06F 11/1048* (2013.01); *G11C 11/5628* (2013.01);
(Continued)

(58) Field of Classification Search
CPC ...................................................... G11C 16/26
See application file for complete search history.

(56) References Cited

U.S. PATENT DOCUMENTS 6,026,024 A 2/2000 Odani et al.
7,080,192 B1 7/2006 Wong
(Continued)

FOREIGN PATENT DOCUMENTS

CN 101388248 A 3/2009
JP 5-282880 10/1993
(Continued)

OTHER PUBLICATIONS

International Search Report mailed on Feb. 8, 2011 issued for International Application No. PCT/JP2010/069608 filed Nov. 4, 2010 (w/English translation).
(Continued)

*Primary Examiner* — Hoai V Ho
(74) *Attorney, Agent, or Firm* — Oblon, McClelland, Maier & Neustadt, L.L.P.

(57) ABSTRACT

According to one embodiment, a memory system includes a nonvolatile semiconductor memory device, a voltage generation unit and a control unit. The nonvolatile semiconductor memory device includes a memory cell array having a plurality of blocks each including a plurality of memory cells, and a voltage generation unit configured to change a read level of the memory cell. The control unit controls write, read, and erase of the nonvolatile semiconductor memory device. The control unit changes the read level between a start of use of the nonvolatile semiconductor memory device and a timing after an elapse of a time.

20 Claims, 15 Drawing Sheets

Related U.S. Application Data continuation of application No. 17/137,547, filed on Dec. 30, 2020, now Pat. No. 11,475,962, which is a continuation of application No. 16/502,302, filed on Jul. 3, 2019, now Pat. No. 10,916,312, which is a continuation of application No. 15/982,024, filed on May 17, 2018, now Pat. No. 10,373,692, which is a continuation of application No. 15/673,512, filed on Aug. 10, 2017, now Pat. No. 10,020,063, which is a continuation of application No. 15/343,484, filed on Nov. 4, 2016, now Pat. No. 9,767,913, which is a continuation of application No. 14/565,522, filed on Dec. 10, 2014, now Pat. No. 9,524,786, which is a continuation of application No. 13/462,022, filed on May 2, 2012, now Pat. No. 8,929,140, which is a continuation of application No. PCT/JP2010/069608, filed on Nov. 4, 2010.

(51) Int. Cl.

| | |
|---|---|
| ***G11C 11/56*** | (2006.01) |
| ***G11C 16/04*** | (2006.01) |
| ***G11C 16/14*** | (2006.01) |
| ***G11C 16/24*** | (2006.01) |
| ***G11C 16/34*** | (2006.01) |
| *G06F 11/34* | (2006.01) |

(52) U.S. Cl.

CPC ...... *G11C 11/5642* (2013.01); *G11C 16/0483* (2013.01); *G11C 16/14* (2013.01); *G11C 16/24* (2013.01); *G11C 16/34* (2013.01); *G11C 16/3418* (2013.01); *G06F 11/3466* (2013.01); *G06F 2201/88* (2013.01)

(56) References Cited

U.S. PATENT DOCUMENTS

| | | | | |
|---|---|---|---|---|
| 7,333,364 | B2 | 2/2008 | Yu et al. | |
| 7,558,109 | B2 | 7/2009 | Brandman | |
| 8,929,140 | B2 | 1/2015 | Nagashima | |
| 9,524,786 | B2 | 12/2016 | Nagashima | |
| 9,767,913 | B2 | 9/2017 | Nagashima | |
| 10,373,692 | B2 | 8/2019 | Nagashima | |
| 10,916,312 | B2 * | 2/2021 | Nagashima ........ | G11C 16/3418 |
| 11,475,962 | B2 | 10/2022 | Nagashima | |
| 2005/0013171 | A1 | 1/2005 | Ban et al. | |
| 2005/0073884 | A1 | 4/2005 | Gonzalez et al. | |
| 2006/0028875 | A1 | 2/2006 | Avraham | |
| 2007/0253256 | A1 | 11/2007 | Aritome | |
| 2007/0258306 | A1 | 11/2007 | Riekels et al. | |
| 2008/0123408 | A1 | 5/2008 | Honma | |
| 2008/0123420 | A1 | 5/2008 | Brandman et al. | |
| 2008/0285351 | A1 | 11/2008 | Shlick et al. | |
| 2009/0049364 | A1 | 2/2009 | Jo | |
| 2009/0067257 | A1 | 3/2009 | Lee et al. | |
| 2009/0207659 | A1 | 8/2009 | Song | |
| 2009/0222636 | A1 * | 9/2009 | Yano .................. | G06F 12/0866 711/E12.002 |
| 2009/0228640 | A1 | 9/2009 | Kurashige | |
| 2009/0228739 | A1 | 9/2009 | Cohen | |
| 2010/0246257 | A1 | 9/2010 | Ito et al. | |
| 2010/0313084 | A1 | 12/2010 | Hida | |

FOREIGN PATENT DOCUMENTS

| | | |
|---|---|---|
| JP | 08-077785 | 3/1996 |
| JP | 10-255487 | 9/1998 |
| JP | 2000-149580 | 5/2000 |
| JP | 2004-326866 | 11/2004 |
| JP | 2004-326867 | 11/2004 |
| JP | 2007-507804 | 3/2007 |
| JP | 2008-117471 | 5/2008 |
| JP | 2008-269473 | 11/2008 |
| JP | 2009-26436 | 2/2009 |
| JP | 2009-48758 | 3/2009 |
| JP | 2009-70501 | 4/2009 |
| JP | 2009-070542 | 4/2009 |
| JP | 2009-151919 | 7/2009 |
| JP | 2009-205578 | 9/2009 |
| JP | 2009-536423 | 10/2009 |
| KR | 10-2008-0100791 | 11/2008 |
| WO | WO 2009/110142 A1 | 9/2009 |

OTHER PUBLICATIONS

International Written Opinion mailed on Feb. 8, 2011 issued for International Application No. PCT/JP2010/069608 filed Nov. 4, 2010.
Japanese Office Action Issued Mar. 19, 2013 in Patent Application No. 2009-255314 (w/English translation).
English Translation of the International Preliminary Report on Patentability issued Jun. 21, 2012 in PCT/JP2010/069608.
English Translation of the Written Opinion issued Feb. 8, 2011 in PCT/JP2010/069608.
Office Action issued Oct. 22, 2013 in Korean Patent Application No. 10-2012-7006488 (w/English language translation).
Combined Office Action and Search Report issued Feb. 7, 2014 in Chinese Patent Application No. 201080040585.X with English language translation.
Combined Office Action and Search Report issued Apr. 18, 2014, in Taiwanese Patent Application No. 099138212 with English translation.

* cited by examiner

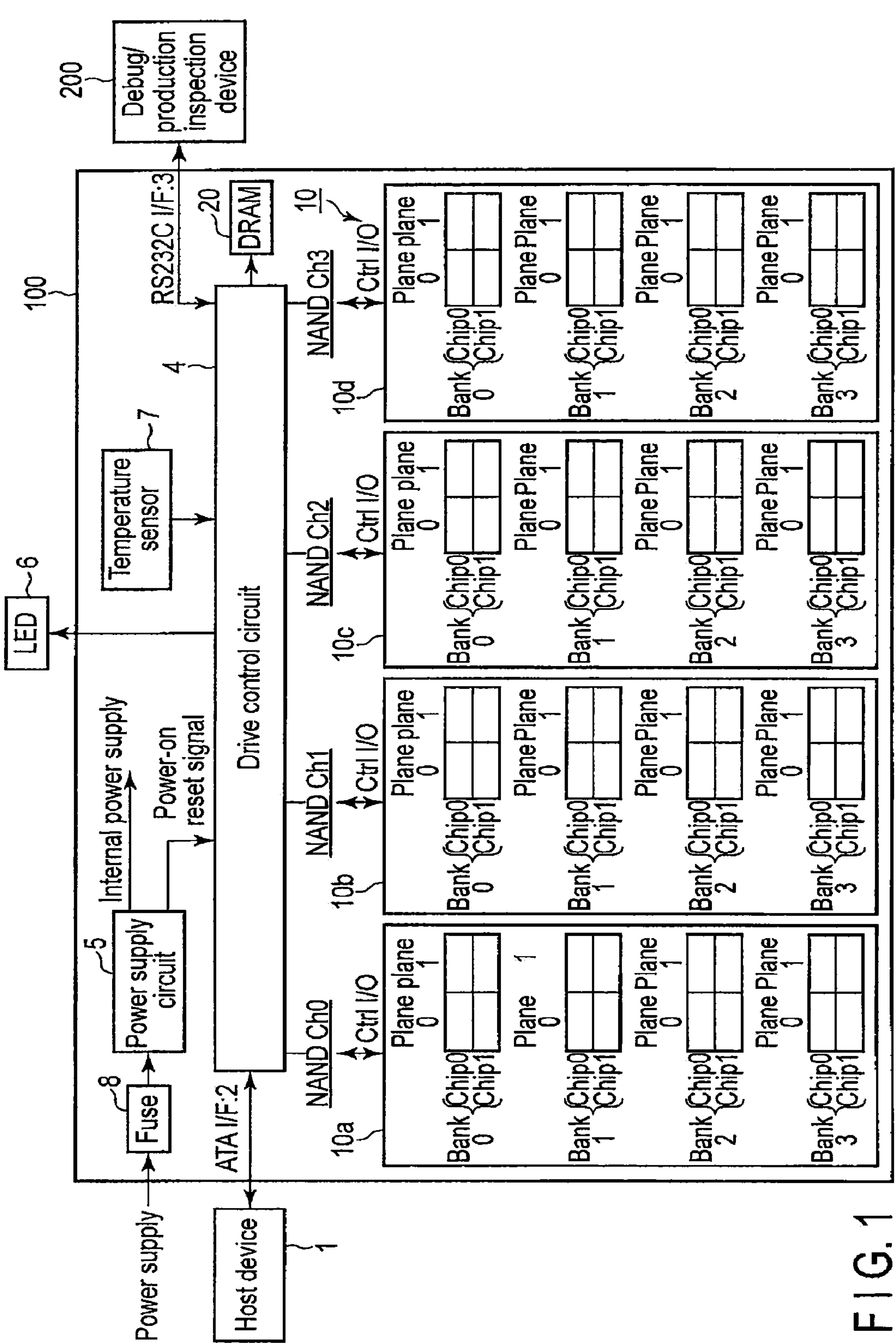
F I G. 1

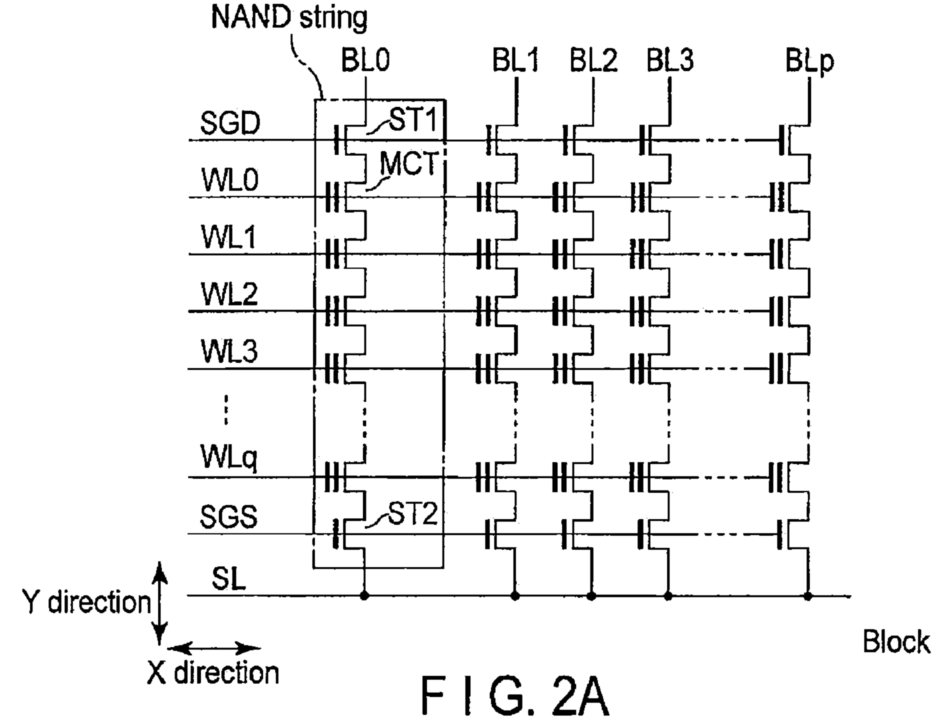
F I G. 2A
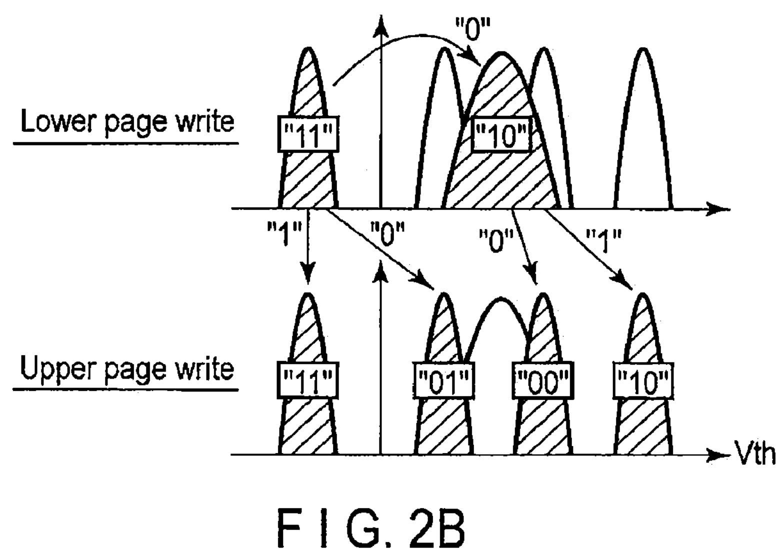
F I G. 2B

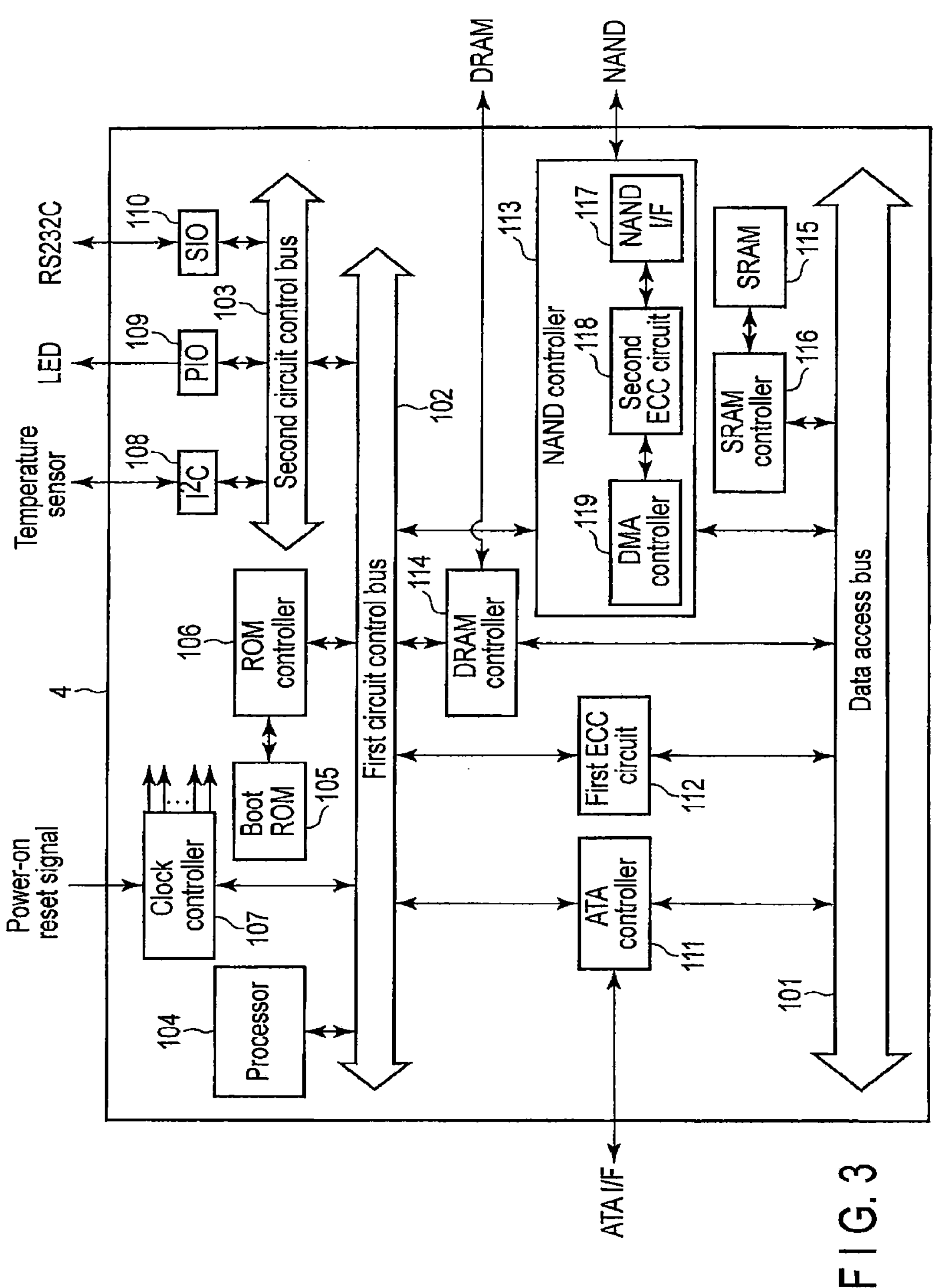
F I G. 3

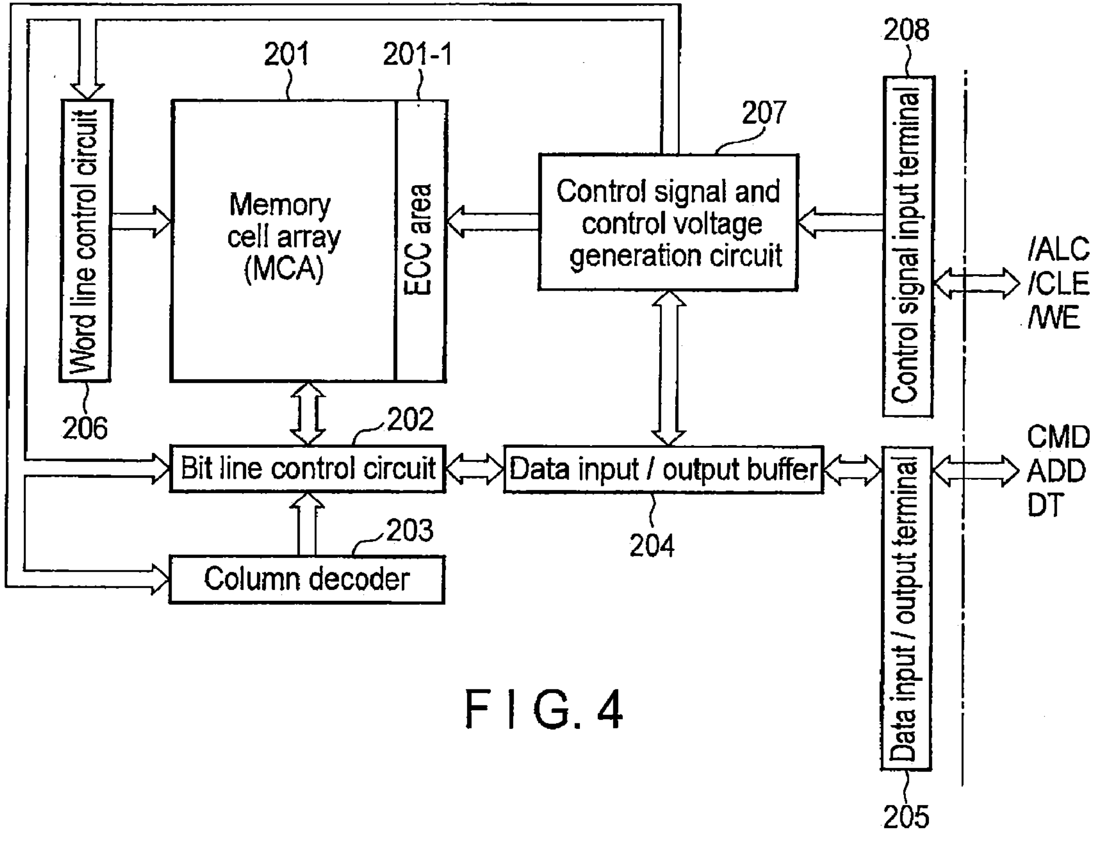
F I G. 4

| Data area | ECC area |
|---|---|

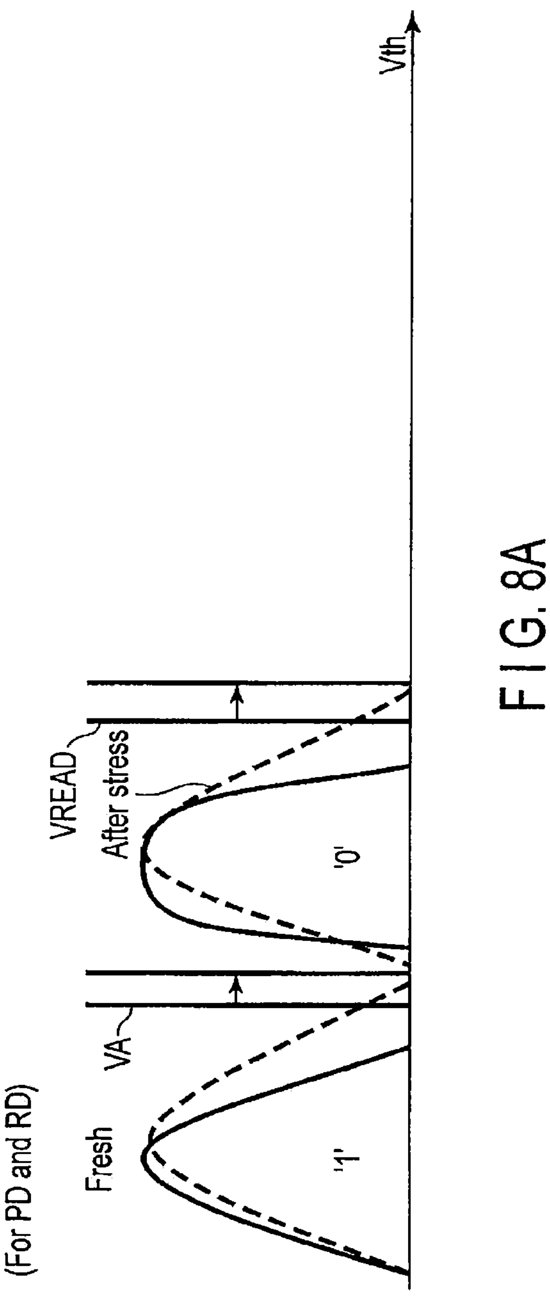
F I G. 8A

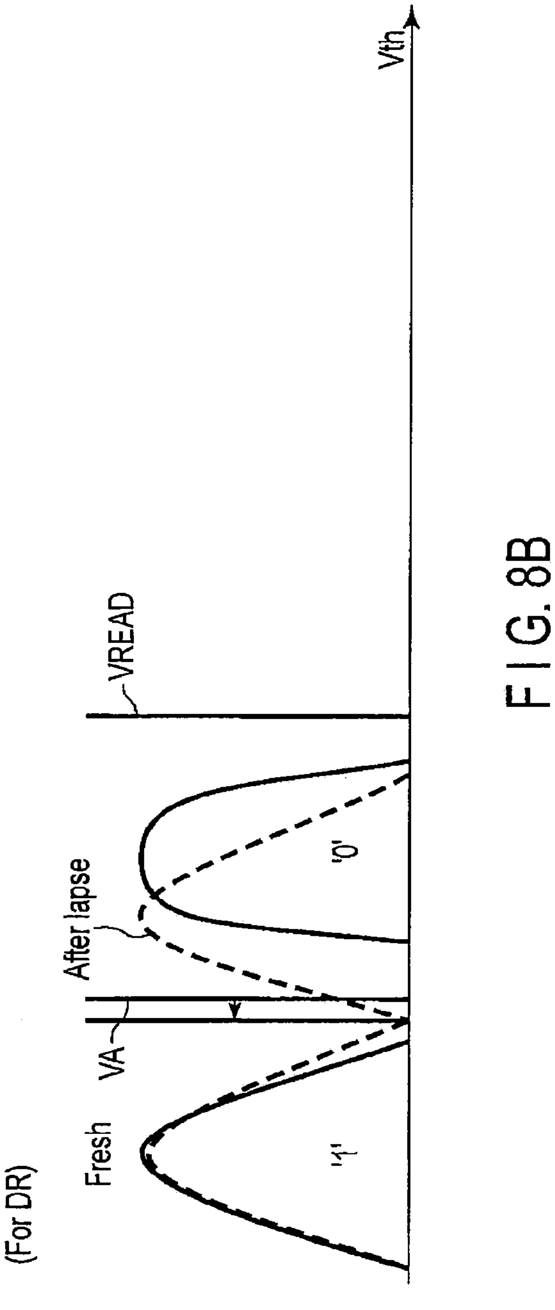
F I G. 8B

| Physical address | Monitor read status data |
| --- | --- |
F I G. 11
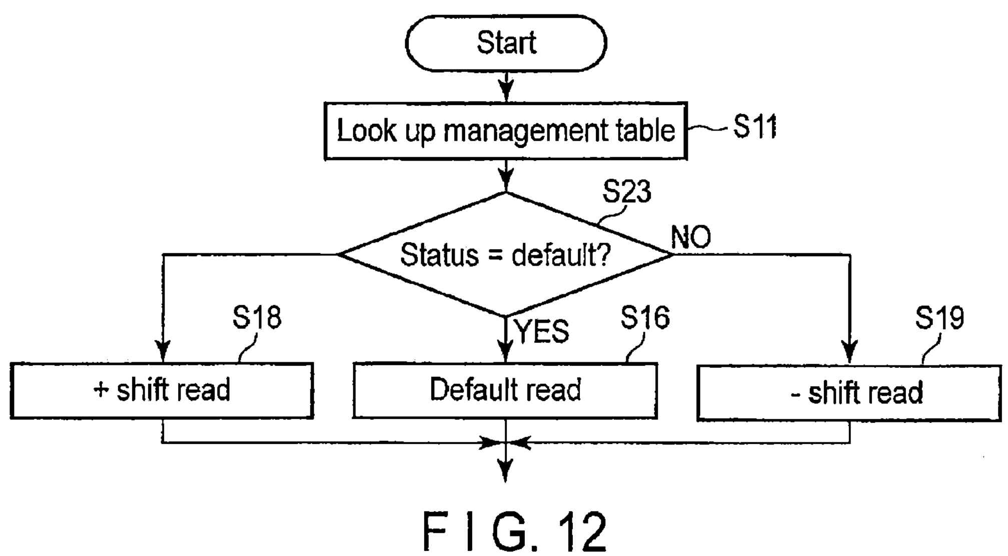
F I G. 12
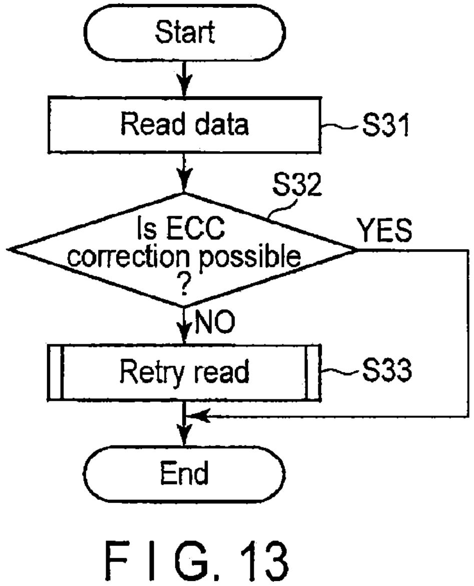
F I G. 13

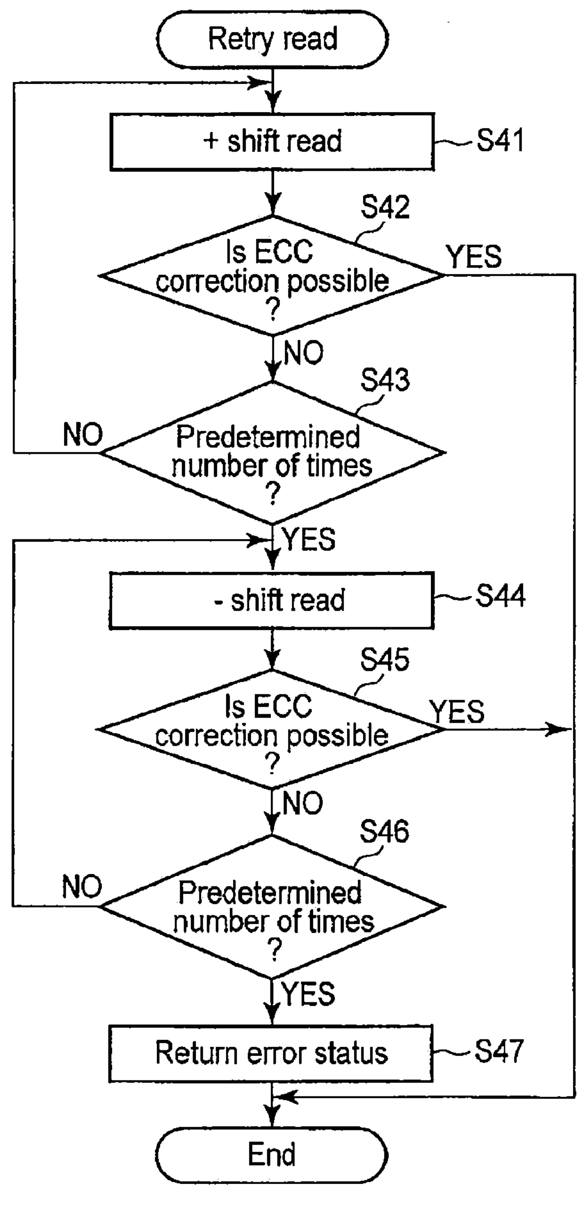
F I G. 14

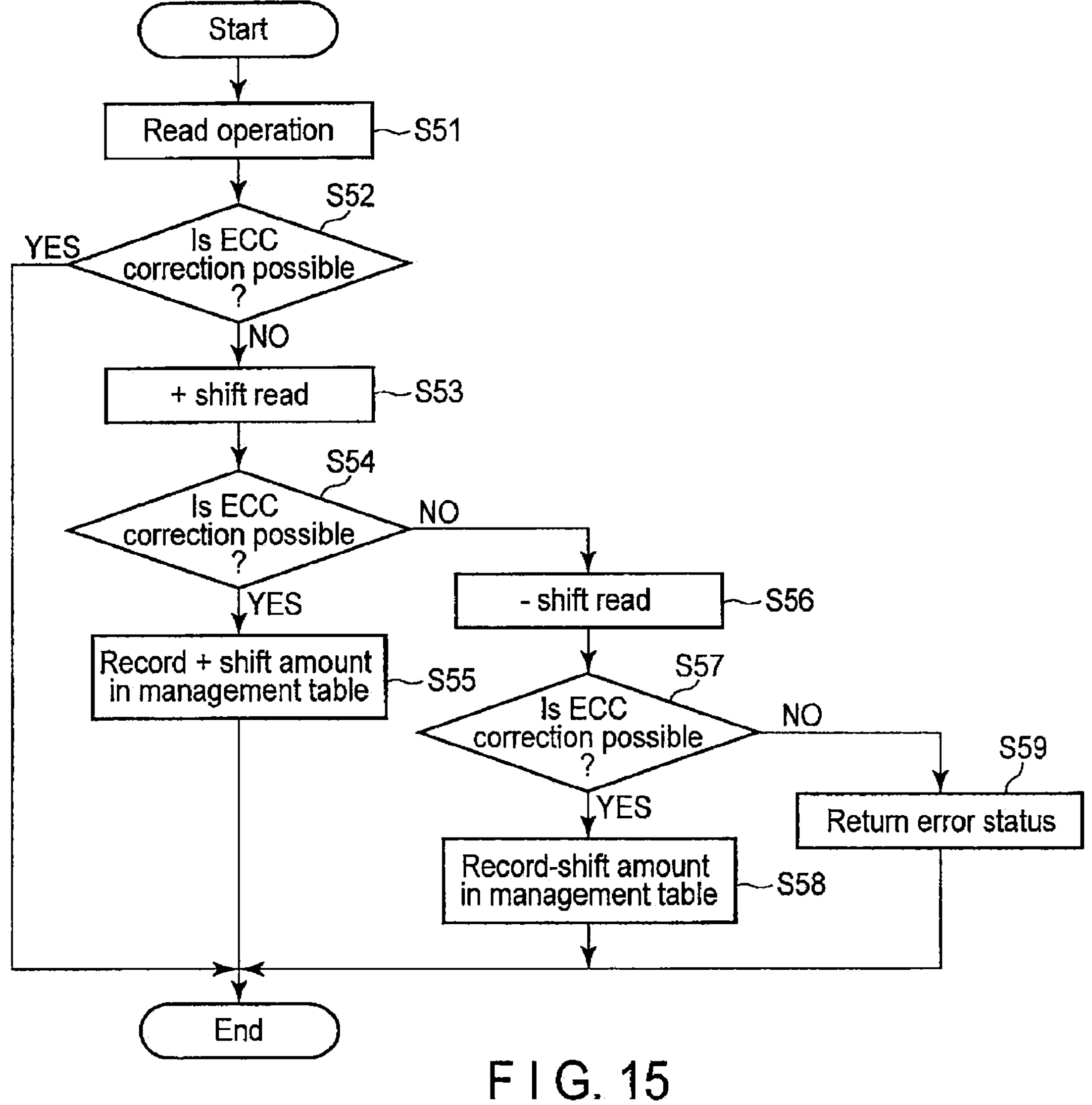
F I G. 15

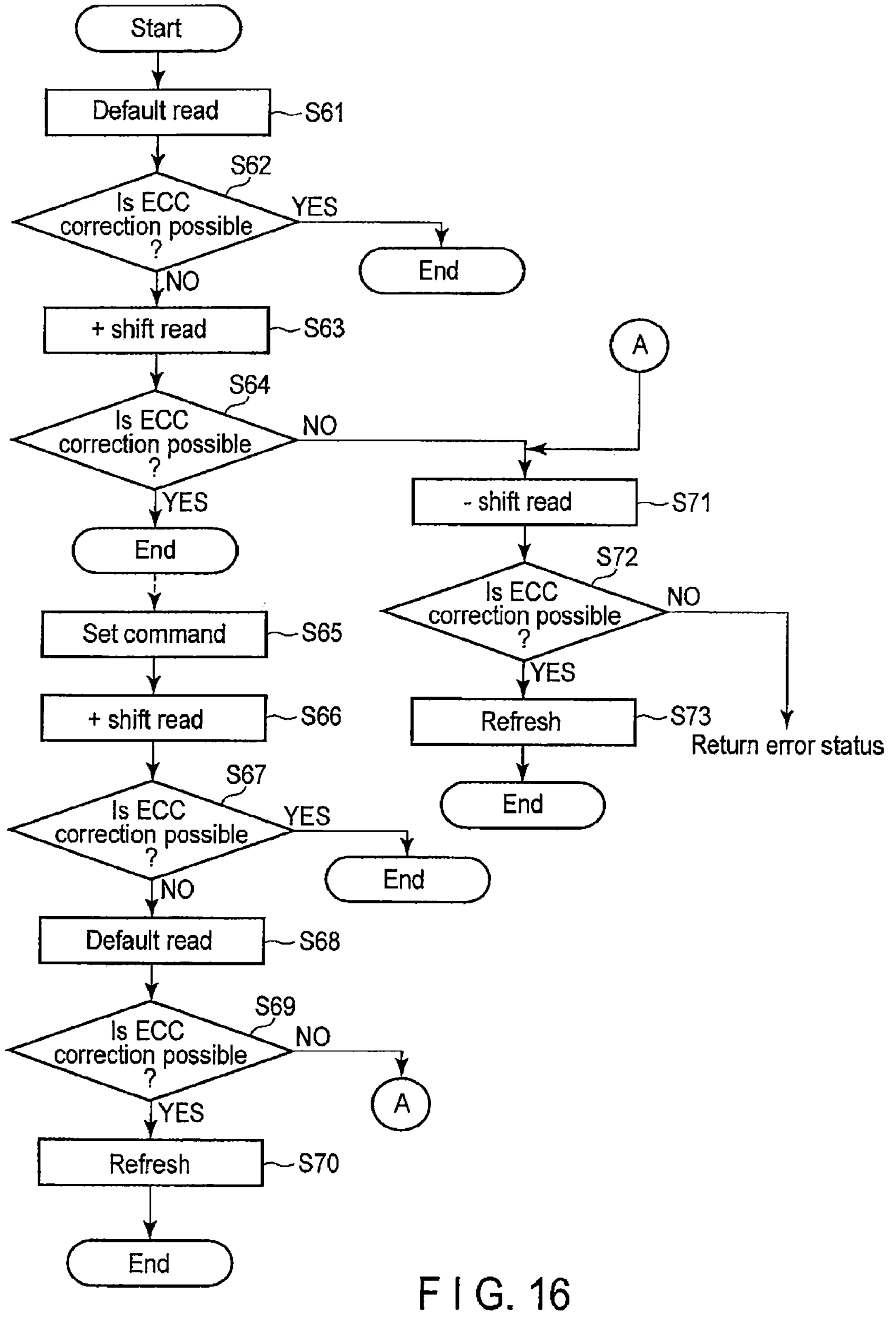
F I G. 16

MEMORY SYSTEM PERFORMING READ OPERATION USING READ VOLTAGE

CROSS-REFERENCE TO RELATED APPLICATIONS

This application is a continuation of and claims the benefit of priority under 35 U.S.C. § 120 from U.S. application Ser. No. 17/967,006 filed Oct. 17, 2022, which is a continuation of U.S. application Ser. No. 17/137,547 filed Dec. 30, 2020 (now U.S. Pat. No. 11,475,962 issued Oct. 18, 2022), which is a continuation of U.S. application Ser. No. 16/502,302 filed Jul. 3, 2019 (now U.S. Pat. No. 10,916,312 issued Feb. 9, 2021), which is a continuation of U.S. application Ser. No. 15/982,024 filed May 17, 2018 (now U.S. Pat. No. 10,373,692 issued Aug. 6, 2019), which is a continuation of U.S. application Ser. No. 15/673,512 filed Aug. 10, 2017 (now U.S. Pat. No. 10,020,063 issued Jul. 10, 2018), which is continuation of U.S. application Ser. No. 15/343,484 filed Nov. 4, 2016 (now U.S. Pat. No. 9,767,913 issued Sep. 19, 2017), which is a continuation of U.S. application Ser. No. 14/565,522 filed Dec. 10, 2014 (now U.S. Pat. No. 9,524,786 issued Dec. 20, 2016), which is a continuation of U.S. application Ser. No. 13/462,022 filed May 2, 2012 (now U.S. Pat. No. 8,929,140 issued Jan. 6, 2015), which is a continuation of PCT Application No. PCT/JP2010/069608 filed Nov. 4, 2010, and claims the benefit of priority under 35 U.S.C. § 119 from Japanese Patent Application No. 2009-255314 filed Nov. 6, 2009, the entire contents of each of which are incorporated herein by reference.

FIELD

Embodiments described herein relate generally to a memory system using, for example, a NAND flash memory.

BACKGROUND

As an alternative to a hard disk drive, an SSD (Solid State Drive) using, for example, a NAND flash memory has been developed. Along with the micronization of NAND flash memories in recent years is the growing influence of interference noise between adjacent cells, which leads to a higher possibility of write errors. In addition, repetitive writing and reading of the NAND flash memory may cause errors in data stored in the memory cells. Hence, a memory system using a NAND flash memory performs error correction using ECC (Error Correction Code) to repair read data.

BRIEF DESCRIPTION OF THE DRAWINGS

FIG. 1 is a block diagram showing a memory system according to the first embodiment.

FIG. 2A is a circuit diagram showing an example of a physical block included in a NAND memory chip.

FIG. 2B is a schematic view showing an example of the threshold distributions of a memory cell transistor.

FIG. 3 is a block diagram showing an example of a drive control circuit shown in FIG. 1.

FIG. 4 is a block diagram showing an example of a NAND flash memory included in one chip shown in FIG. 1.

FIG. 8A is a view showing an example of the threshold change of a memory cell that stores binary data.

FIG. 8B is a view showing another example of the threshold change of the memory cell.

FIG. 11 is a view showing another example of the field structure of the management table.

FIG. 12 is a flowchart showing a modification of the first embodiment.

FIG. 13 is a flowchart showing an example of a retry read operation according to the second embodiment.

FIG. 14 is a flowchart showing an example of the retry read operation according to the second embodiment.

FIG. 15 is a flowchart showing a read operation according to the third embodiment.

FIG. 16 is a flowchart showing a read operation according to the fourth embodiment.

DETAILED DESCRIPTION

Figures 5, 6:
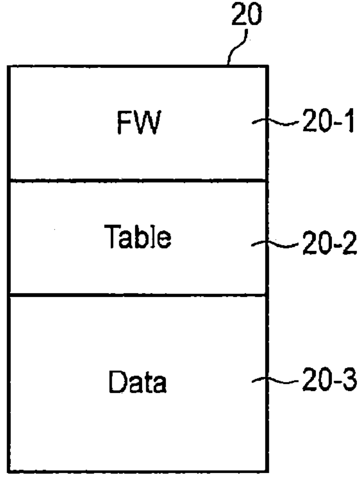
FIG. 5 is a view showing an example of the arrangement of one page of a memory cell array.
FIG. 6 is a view showing an example of the contents stored in a DRAM shown in FIG. 1.

In general, according to one embodiment, a memory system includes a nonvolatile semiconductor memory device, a voltage generation unit and a control unit. The nonvolatile semiconductor memory device includes a memory cell array having a plurality of blocks each including a plurality of memory cells, and a voltage generation unit configured to change a read level of the memory cell. The control unit controls write, read, and erase of the nonvolatile semiconductor memory device. The control unit changes the read level between a start of use of the nonvolatile semiconductor memory device and a timing after an elapse of a time.

In a NAND flash memory, as the memory cell size is reduced, the number of electrons stored in a memory cell decreases. For this reason, the influence of interference noise between adjacent cells is becoming relatively larger. When data write (program) or read is performed for one memory cell, the data of the other adjacent memory cell may change.

For example, data write is done for a memory cell selected by a word line and a bit line. However, there arise two different phenomena; program disturb (to also be referred to as PD hereinafter), which includes first program disturb, in which the threshold voltages are changed to higher voltages when a strong stress acts on a non-write memory cell connected to a selected word line, and second program disturb, in which the threshold voltages are changed to higher voltages when a memory cell connected to an unselected word line is set in a weak write state.

In data read as well, a voltage is applied to each memory cell connected to an unselected word line. For this reason, a phenomenon called read disturb (to also be referred to as RD hereinafter) occurs, in which the threshold voltages are changed to higher voltages when a memory cell connected to an unselected word line is set in a weak write state.

In addition, when data written in a memory cell is not accessed for a long time, electrons are emitted from the floating gate of the memory cell, and the threshold voltages changes to lower voltages. This degrades data retention (to also be referred to as DR hereinafter).

A large-capacity memory system such as an SSD is mounted on a personal computer or a server and used for a long time. For this reason, it is necessary to relieve the influence of PD, RD, and degradation in DR in the system and obtain a higher reliability to enable a stable operation.

The embodiments will now be described with reference to the accompanying drawings.

First Embodiment

FIG. 1 is a block diagram showing an example of the arrangement of an SSD 100 serving as a memory system. The SSD 100 is connected to a host device (to be abbreviated as a host hereinafter) 1 such as a personal computer or a CPU core via a memory connection interface such as an ATA interface (ATA I/F) 2 and functions as an external memory of the host 1. The SSD 100 can transmit/receive data to/from a debug/production inspection device 200 via a communication interface 3 such as an RS232C interface (RS232C I/F).

The SSD 100 includes a NAND flash memory (to be abbreviated as a NAND memory hereinafter) 10 serving as a nonvolatile semiconductor memory, a drive control circuit 4 serving as a controller, a DRAM 20 serving as a volatile semiconductor memory, a power supply circuit 5, a status indicator LED 6, a temperature sensor 7 that detects the temperature in the drive, and a fuse 8.

The power supply circuit 5 generates a plurality of different internal DC power supply voltages from an external DC power supplied from a power supply circuit on the side of the host 1, and supplies them to the circuits in the SSD 100. The power supply circuit 5 also detects the rise of the external power supply, generates a power-on reset signal, and supplies it to the drive control circuit 4.

The fuse 8 is provided between the power supply circuit on the side of the host 1 and the power supply circuit 5 in the SSD 100. When an overcurrent is supplied from the external power supply circuit, the fuse 8 burns out to prevent error operations of the internal circuits.

The NAND memory 10 includes, for example, four parallel operation elements 10*a* to 10*d* that perform four parallel operations. The four parallel operation elements 10*a* to 10*d* are connected to the drive control circuit 4 via four channels (ch0 to ch3). Each of the parallel operation elements 10*a* to 10*d* includes a plurality of banks capable of bank interleave. That is, each parallel operation element includes, for example, four banks (Bank 0 to Bank 3). Each bank includes a plurality of NAND memory chips, for example, two memory chips (Chip 0 and Chip 1).

Each memory chip is divided into two districts, that is, plane 0 and plane 1 each including a plurality of physical blocks. Plane 0 and plane 1 include peripheral circuits (for example, row decoders, column decoders, page buffers, and data caches) independent from each other. Hence, using a double speed mode makes it possible to simultaneously perform erase/write/read in plane 0 and plane 1.

As described above, each NAND memory chip of the NAND memory 10 enables parallel operations by the plurality of channels, bank interleave operations by the plurality of banks, interleave operations by the plurality of chips in a single bank, and parallel operations in the double speed mode using the plurality of planes. Note that each memory chip may be divided into three or more planes or undivided.

The DRAM 20 functions as a data transfer cache, a work area memory, and the like between the host 1 and the NAND memory 10. The work area memory of the DRAM 20 stores, for example, a master table (snapshot) where various kinds of management tables stored in the NAND memory 10 are expanded at the time of activation or the like, and log information representing the change difference of the management tables.

Note that a nonvolatile random access memory such as an FeRAM (Ferroelectric Random Access Memory), an MRAM (Magnetoresistive Random Access Memory), or a PRAM (Phase change Random Access Memory) can also be used in place of the DRAM 20. When a nonvolatile random access memory is used, an operation of saving various kinds of management tables and the like to the NAND memory 10 upon power-off can be omitted partially or wholly.

The drive control circuit 4 performs data transfer control between the host 1 and the NAND memory 10 via the DRAM 20, and also controls the constituent elements in the SSD 100. The drive control circuit 4 also has functions of supplying a status indication signal to the status indicator LED 6, and receiving a power-on reset signal from the power supply circuit 5 and supplying a reset signal and a clock signal to the units in the drive control circuit 4 and the SSD 100.

Each NAND memory chip is formed by arraying a plurality of physical blocks that are units of data erase.

FIG. 2A is a circuit diagram showing an example of the arrangement of one physical block included in a NAND memory chip. Each physical block includes (p+1) NAND strings sequentially juxtaposed in the X direction (p is an integer of 0 or more). A select transistor ST1 included in each NAND string has a drain connected to a corresponding one of bit lines BL0 to BLp, and a gate commonly connected to a select gate line SGD. A select transistor ST2 has a source commonly connected to a source line SL, and a gate commonly connected to a select gate line SGS.

Each memory cell transistor (to also be referred to as a memory cell) MCT is formed from a MOSFET (Metal Oxide Semiconductor Field Effect Transistor) having a stacked gate structure formed on a semiconductor substrate. The stacked gate structure includes a charge accumulation layer (floating gate electrode) formed on a gate insulating film on the semiconductor substrate, and a control gate electrode formed on an inter-gate insulating film on the charge accumulation layer. The memory cell transistor MCT changes the threshold voltage in accordance with the number of electrons accumulated in the floating gate electrode, and stores data based on the difference in the threshold voltage. The memory cell transistor MCT can be configured to store 1-bit data or multilevel data (data of 2 bits or more).

The memory cell transistor MCT need not always have the structure including the floating gate electrode, and may have a structure such as a MONOS (Metal-Oxide-Nitride-Oxide-Silicon) structure capable of adjusting the threshold voltages by causing a nitride film interface serving as a charge accumulation layer to trap electrons. The memory cell transistor MCT having the MONOS structure can also be configured to store 1-bit data or multilevel data (data of 2 bits or more).

In each NAND string, the (q+1) memory cell transistors MCT are arranged so as to connect their current paths in series between the source of the select transistor ST1 and the drain of the select transistor ST2. That is, the plurality of memory cell transistors MCT are connected in series in the Y direction such that adjacent memory cell transistors share a diffusion region (source region or drain region).

In each NAND string, the control gate electrodes are connected to word lines WL0 to WLq, respectively, sequentially from the memory cell transistor MCT located closest to the drain side. Hence, the drain of the memory cell transistor MCT connected to the word line WL0 is connected to the source of the select transistor ST1. The source of the memory cell transistor MCT connected to the word line WLq is connected to the drain of the select transistor ST2.

The word lines WL0 to WLq commonly connect the control gate electrodes of the memory cell transistors MCT between the NAND strings in the physical block. That is, the control gate electrodes of the memory cell transistors MCT on the same row of the block are connected to the same word line WL. The (p+1) memory cell transistors MCT connected to the same word line WL are handled as one page (physical page). Data write and data read are performed for each physical page.

The bit lines BL0 to BLp commonly connect the drains of the select transistors ST1 between the blocks. That is, the NAND strings on the same column in the plurality of blocks are connected to the same bit line BL.

FIG. 2B is a schematic view showing threshold distributions in, for example, a quaternary data storage method for storing 2-bit data in one memory cell transistor MCT. In the quaternary data storage method, one of quaternary data "xy" defined by upper page data "x" and lower page data "y" can be retained in one memory cell transistor MCT.

As the quaternary data "xy", for example, data "11", "01", "00", and "10" are assigned in the order of threshold voltages of the memory cell transistor MCT. Data "11" corresponds to an erase state in which the threshold voltage of the memory cell transistor MCT has, for example, a negative value. Note that the data assignment rule is not limited to this. Alternatively, data of 3 or more bits may be stored in one memory cell transistor MCT.

In a lower page write operation, the lower bit data "y" is selectively written in the memory cell transistor MCT of data "11" (erase state), thereby writing data "10". The threshold distribution of data "10" before upper page write is located almost at the center position between the threshold distribution of data "01" and that of data "00" after the upper page write. The threshold distribution may be broader than that after the upper page write. In an upper page write operation, the upper bit data "x" is selectively written in each of the memory cell of data "11" and the memory cell of data "10", thereby writing data "01" and data "00". In a pseudo SLC mode, write is performed using only the lower page. The lower page write is faster than the upper page write.

FIG. 3 is a block diagram showing an example of the internal hardware arrangement of the drive control circuit 4. The drive control circuit 4 includes a data access bus 101, a first circuit control bus 102, and a second circuit control bus 103. A processor 104 that controls the entire drive control circuit 4 is connected to the first circuit control bus 102. A boot ROM 105 is connected to the first circuit control bus 102 via a ROM controller 106. The boot ROM 105 stores boot programs that boot management programs (FW: firmware) stored in the NAND memory 10.

A clock controller 107 is connected to the first circuit control bus 102. The clock controller 107 receives the power-on reset signal from the power supply circuit 5 shown in FIG. 1 and supplies the reset signal and the clock signal to the units.

The second circuit control bus 103 is connected to the first circuit control bus 102. An $I^2C$ circuit 108 to receive data from the temperature sensor 7 shown in FIG. 1, a parallel IO (PIO) circuit 109 that supplies the status indication signal to the status indicator LED 6, and a serial IO (SIO) circuit 110 that controls the RS232C I/F 3 are connected to the second circuit control bus 103.

An ATA interface controller (ATA controller) 111, a first ECC (Error Checking and Correction) circuit 112, a NAND controller 113, and a DRAM controller 114 are connected to both the data access bus 101 and the first circuit control bus 102. The ATA controller 111 transmits/receives data to/from the host 1 via the ATA interface 2. An SRAM 115 to be used as a data working area and a firmware expansion area is connected to the data access bus 101 via an SRAM controller 116. At the time of activation, the firmware stored in the NAND memory 10 is transferred to the SRAM 115 by the boot program stored in the boot ROM 105.

The NAND controller 113 includes a NAND I/F 117, a second ECC circuit 118, and a DMA transfer control DMA controller 119. The NAND I/F 117 performs interface processing to the NAND memory 10. The DMA transfer control DMA controller 119 performs access control between the NAND memory 10 and the DRAM 20. The second ECC circuit 118 encodes a second correction code and encodes/decodes a first error correction code.

The first ECC circuit 112 decodes the second error correction code. Examples of the first error correction code and the second error correction code are a Hamming code, a BCH (Bose Chaudhuri Hocqenghem) code, an RS (Reed Solomon) code, and an LDPC (Low Density Parity Check) code. The correction capability of the second error correction code is higher than that of the first error correction code. The first error correction code is generated from, for example, data of each sector, which is the access unit, from the host 1 to the SSD 100. On the other hand, the second error correction code is generated from, for example, data of each page including a plurality of sectors. A CRC (Cyclic Redundancy Check) code may be added to the data of each sector for error detection.

As shown in FIG. 1, the four parallel operation elements 10*a* to 10*d* of the NAND memory 10 are parallelly connected to the NAND controller 112 in the drive control circuit 4 via the four channels each formed from a plurality of bits and can therefore perform parallel operations. The NAND memory 10 of each channel is divided into four banks capable of bank interleave, and plane 0 and plane 1 of each memory chip can simultaneously be accessed. Hence, a maximum of eight physical blocks (four banks×two planes) per channel can be controlled almost simultaneously. That is, processing such as write can be executed simultaneously for eight physical blocks at maximum.

FIG. 4 is a functional block diagram showing an example of a NAND flash memory included in one NAND memory chip shown in FIG. 1.

A memory cell array 201 includes a plurality of bit lines, a plurality of word lines, and a common source line. Memory cells each formed from, for example, an EEPROM cell and capable of electrically rewrite data are arranged in a matrix. A bit control circuit 202 for controlling the bit lines and a word line control circuit 206 are connected to the memory cell array 201.

The bit line control circuit 202 reads data of a memory cell in the memory cell array 201 via a bit line, or detects the state of a memory cell in the memory cell array 201 via a bit line. The bit line control circuit 202 also applies a write control voltage to a memory cell in the memory cell array 201 via a bit line to write data to the memory cell. A column decoder 203 and a data input/output buffer 204 are connected to the bit line control circuit 202.

The data storage circuit in the bit line control circuit 202 is selected by the column decoder 203. Data of a memory cell read to the data storage circuit is externally output from a data input/output terminal 205 via the data input/output buffer 204. The data input/output terminal 205 is connected to the drive control circuit 4 outside the memory chip.

The drive control circuit 4 receives data output from the data input/output terminal 205. The drive control circuit 4 outputs various kinds of commands CMD to control the operation of the NAND flash memory, addresses ADD, and data DT. Write data input from the drive control circuit 4 to the data input/output terminal 205 is supplied, via the data input/output buffer 204, to the data storage circuit selected by the column decoder 203. Commands and addresses input from the drive control circuit 4 to the data input/output terminal 205 are supplied to a control signal and control voltage generation circuit 207.

The word line control circuit 206 is connected to the memory cell array 201. The word line control circuit 206 selects a word line in the memory cell array 201 and applies a voltage necessary for read, write, or erase to the selected word line.

The memory cell array 201, the bit line control circuit 202, the column decoder 203, the data input/output buffer 204, and the word line control circuit 206 are connected to the control signal and control voltage generation circuit 207 and controlled by the control signal and control voltage generation circuit 207.

The control signal and control voltage generation circuit 207 is connected to a control signal input terminal 208 and controlled by various kinds of control signals such as/ALE (address latch enable),/CLE (command latch enable), and/WE (write enable) input from the drive control circuit 4 via the control signal input terminal 208, and the commands CMD input from the drive control circuit 4 via the data input/output terminal 205 and the data input/output buffer 204.

The control signal and control voltage generation circuit 207 generates voltages to the word lines and the bit lines and also generates a voltage to be applied to a well at the time of data write. The control signal and control voltage generation circuit 207 includes a boost circuit such as a charge pump circuit and can generate a program voltage, a read voltage, and an erase voltage.

The control signal and control voltage generation circuit 207 can change the level of the read voltage, as will be described later. That is, the control signal and control voltage generation circuit 207 has a function of shifting the voltage to be applied to a word line at the time of read in the + or − direction upon receiving the various kinds of control signals input via the control signal input terminal 208 and the commands CMD input via the data input/output terminal 205 and the data input/output buffer 204.

The bit line control circuit 202, the column decoder 203, the word line control circuit 206, and the control signal and control voltage generation circuit 207 constitute a write circuit and a read circuit.

The memory cell array 201 has a storage area 201-1 for storing ECCs (Error Correction Codes) in addition to the storage area for storing main body data.

FIG. 5 shows the arrangement of one page of the memory cell array 201. Each page includes a data area for storing user data and an ECC area for storing ECCs. Note that each page may include internal flag data to be used by the control signal and control voltage generation circuit 207.

FIG. 6 shows the contents stored in the DRAM 20 shown in FIG. 1. The DRAM 20 includes a firmware area 20-1, a table area 20-2, and a data area 20-3. The firmware area 20-1 stores firmware necessary for the operation of the drive control circuit 4. The table area 20-2 stores, for example, management tables necessary for a read operation to be described later. The data area 20-3 is used as, for example, a write cache or a read cache.

The firmware area 20-1 is usable as an expansion area for firmware necessary for the operation of the drive control circuit 4 that cannot be stored in the SRAM 115 shown in FIG. 3. The table area 20-2 includes, for example, a cache management table to be used to manage the write cache and read cache mechanism in the data area 20-3 of the DRAM 20, and a logical-physical address translation table to be used to manage the correspondence between a logical address input from the host 1 and a physical address of the NAND memory 10.

Of the contents stored in the DRAM 20, especially master tables such as the logical-physical address translation table included in the table area 20-2 are stored in the save area of the NAND memory 10 when the memory system is powered off. When the memory system is powered on, the master tables are read out from the save area of the NAND memory 10 and loaded to the table area 20-2 of the DRAM 20. Upon powering off the memory system, the latest data included in the data area 20-3 is stored as nonvolatile data at a predetermined location of the NAND memory 10 indicated by the logical-physical address translation table.

(Shift Read Operation)

In the first embodiment, the read level of the NAND flash memory is changed between the initial stage of memory system use and the timing after the elapse of a predetermined time, thereby improving the reliability of the memory system. The initial stage of use indicates, for example, the timing the user actually starts using the memory system after the shipment of it. The timing after the elapse of a predetermined time can be determined by measuring the actual time or based on the number of repetitions of a predetermined operation (write, read, or erase operation) for the NAND flash memory in the memory system.

The threshold voltage corresponding to data stored in a memory cell changes due to program disturb (PD), read disturb (RD), or data retention (DR), as described above.

Figure 7A:
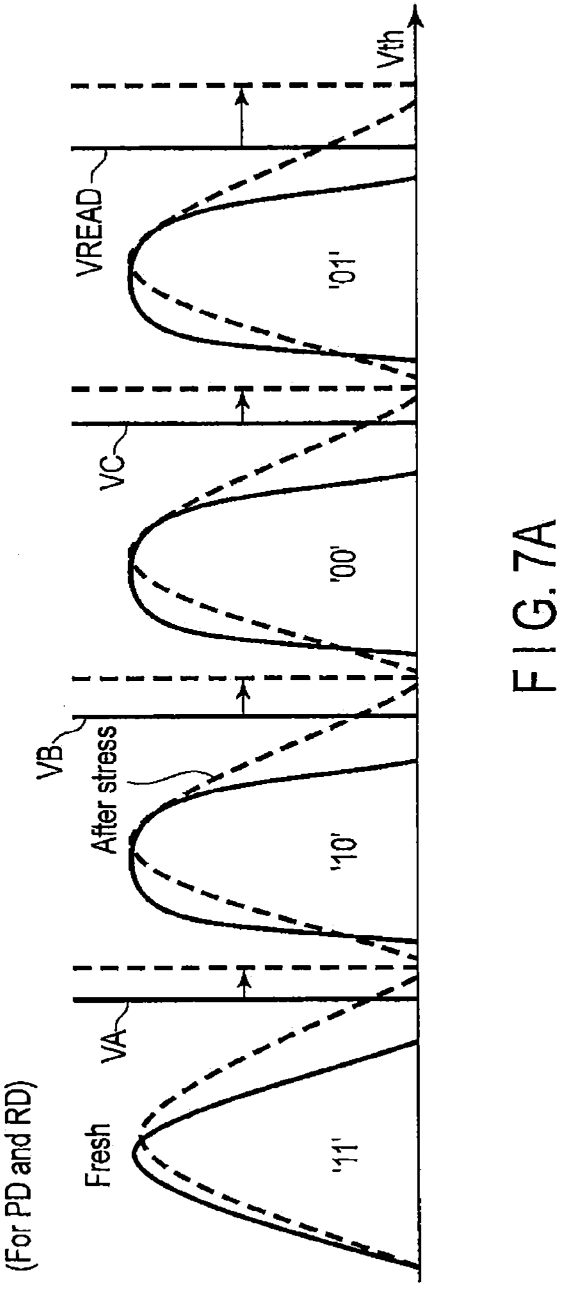
FIG. 7A is a view showing an example of the threshold change of a memory cell that stores multilevel data.

As shown in FIG. 7A, when a memory cell is affected by PD and RD, the threshold voltage distributions of the memory cell change to the higher side, as indicated by the broken lines. For this reason, read voltages (levels) VA, VB, and VC to read the threshold voltages set by default and a read voltage Vread to be supplied to an unselected cell become lower than the changed threshold voltages, respectively. In this case, the data cannot correctly be read.

The influence of program disturb on a memory cell is disclosed in, for example, Jpn. Pat. Appln. KOKAI Publication No. 2008-117471 (U.S. application Ser. No. 11/934,330 registered as U.S. Pat. No. 7,613,048 is based upon and claims the benefit of priority from it). The influence of read disturb on a memory cell is disclosed in, for example, Jpn. Pat. Appln. KOKAI Publication No. 2004-326867 (U.S. application Ser. No. 10/822,177 registered as U.S. Pat. No. 7,099,190 is based upon and claims the benefit of priority from it). The entire contents of them are incorporated herein by reference.

Figure 7B:
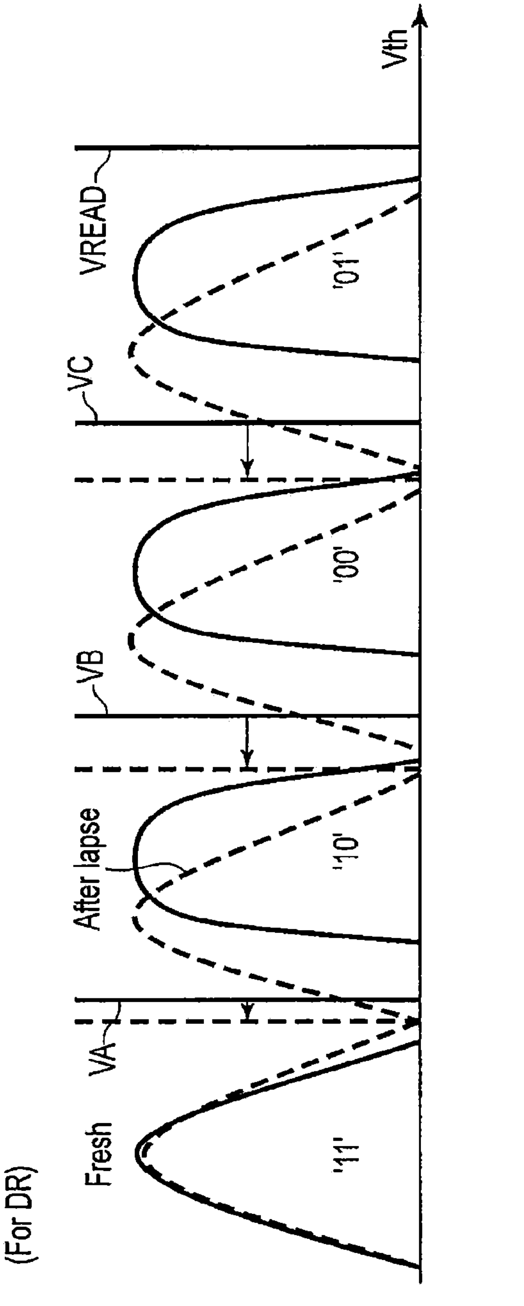
FIG. 7B is a view showing another example of the threshold change of the memory cell.

On the other hand, as shown in FIG. 7B, when a memory cell is affected by DR, the threshold voltage distributions of the memory cell change to the lower side, as indicated by the broken lines. For this reason, the read levels VA, VB, and VC to read the threshold voltages set by default become higher than the changed threshold voltages, respectively. Hence, the data cannot correctly be read.

The data retention characteristic of a memory cell is disclosed in, for example, Jpn. Pat. Appln. KOKAI Publication No. 2008-269473 (U.S. application Ser. No. 12/107, 984 is based upon and claims the benefit of priority from it), the entire contents of which are incorporated herein by reference.

The phenomena associated with PD, RD, and DR apply not only to a memory cell (MLC: Multi Level Cell) for storing data of three or more values, as shown in FIGS. 7A and 7B but also to a memory cell (SLC: Single Level Cell) for storing binary data, as shown in FIGS. 8A and 8B. However, the influence of PD, RD, and DR is more conspicuous in the MLC because the restrictions of the margin between the threshold voltages are stricter than in the SLC.

In the first embodiment, the read level can be changed in accordance with the use state of the nonvolatile semiconductor memory device. That is, to read data from a memory cell affected by PD and RD, the read levels VA, VB, and VC are set to be higher than the default read levels, as indicated by the broken lines in FIGS. 7A and 8A. As a result, the read levels VA, VB, and VC are located between the threshold voltage distributions, and the data can correctly be read. In addition, the read voltage Vread is also set to be higher than the default read level. As a result, the read voltage Vread is set to be higher than the highest threshold voltage distribution, and the data can correctly be read.

On the other hand, to read data from a memory cell affected by DR, the read levels VA, VB, and VC are set to be lower than the default read levels, as indicated by the broken lines in FIGS. 7B and 8B. As a result, the read levels VA, VB, and VC are located between the threshold voltage distributions, and the data can correctly be read.

Whether a memory cell is affected by PD and RD can be determined by, for example, the write count, the erase count, and the read count of the memory cell, the program voltage application count (program loop count) in one write, or the erase voltage application count (erase loop count) in one erase.

Whether a memory cell is affected by DR can be determined by determining whether the memory cell has not been accessed for a long time. Whether the memory cell has been left to stand for a long time can be determined from, for example, the log of the personal computer on which the memory system is mounted. The data retention characteristic of the memory cell also changes depending on the temperature of the environment where the memory system is placed. Hence, the ambient temperature may be used as the criterion to determine whether the memory cell is affected by DR. For example, the time the threshold voltage distributions change to the lower side when the memory system is left to stand at a high temperature is generally supposed to be shorter than the time the threshold voltage distributions change to the lower side when the memory system is left to stand at a low temperature. The ambient temperature can be acquired using, for example, the temperature sensor 7.

The write count, the erase count, the read count, the loop count, the standing time, and the ambient temperature are managed by a management table in the memory system.

Figure 9:
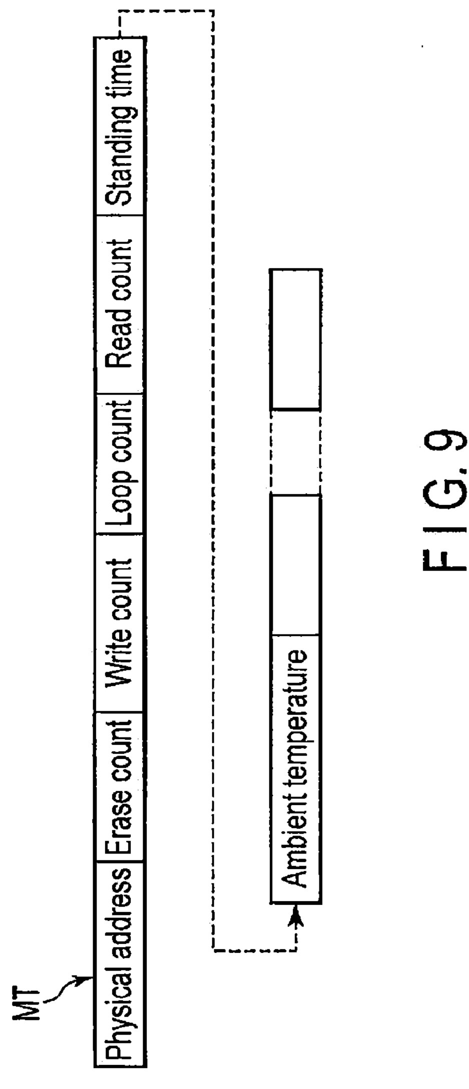
FIG. 9 is a view showing an example of the field structure of a management table.

FIG. 9 is a view showing an example of the field structure of a management table MT stored in the table area 20-2 of the DRAM 20 shown in FIG. 6. Data to be recorded in the management table can be arbitrarily set in accordance with the application purpose of the memory system. In the management table shown in FIG. 9, the erase count, the write count, the loop count, the read count, the standing time, and the ambient temperature are set in correspondence with, for example, a physical block number.

As the rewrite count (W (Write)/E (Erase) count) defined by the erase count or the write count of a block increases, the gate insulating film degrades, and the write speed increases. Hence, a memory cell having a large write count (after the elapse of a predetermined time) is readily affected by PD and RD as compared to an (initial) memory cell having a small write count. That is, the increase amount of the threshold voltages is larger in a memory cell having a large write count than in a memory cell having a small write count even under the same stress.

The memory system according to this embodiment enables correct read by shifting the read levels VA, VB, and VC or the read voltage Vread to be slightly higher (+ shift) when the erase count or write count defining the rewrite count has reached a predetermined value. The predetermined value is determined, for example, in the stage of evaluating the memory cell characteristics at the time of the manufacture of the NAND flash memory. The predetermined value is set to a value smaller than the rewrite guarantee count.

Whether to use the erase count or the write count to define the rewrite count can arbitrarily be determined. One or both of the erase count and the write count can be used. The write is performed on the page basis, and the erase is performed on the block basis. However, for the NAND flash memory, the write is generally performed only once per page until erase. For this reason, managing the erase count often suffices for the purpose of monitoring the rewrite count.

On the other hand, the influence of PD can be estimated to some extent by the write count itself in each block. The order in which the program is performed for the pages included in a block is defined by the specifications. The write is performed once per page. Hence, managing the pages write-accessed in a block allows to determine the degree of shift in the + direction of data stored in a memory cell of the block.

When the write count in each block has reached a predetermined value (for example, the write count when the write is performed for ½ of all pages included in the block), the read levels VA, VB, and VC or the read voltage Vread may be shifted to be slightly higher (+ shift). The predetermined value is determined, for example, in the stage of evaluating the memory cell characteristics at the time of the manufacture of the NAND flash memory or in accordance with the order of write for the pages.

The loop count represents at least one of the number of times the program voltage (program pulse) is applied on one write and the number of times the erase voltage (erase pulse) is applied on one erase.

As described above, as the write count of a memory cell increases, the gate insulating film degrades, and the write speed increases. Hence, if program voltage application needs to be done, for example, 10 times to set a threshold voltage corresponding to predetermined data, ending write by applying the program voltage eight times means that the memory cell has degraded. If the memory cell in the degraded state is affected by PD, the change amount of the threshold voltage is supposed to be larger.

The memory system according to this embodiment enables correct read by shifting the read levels VA, VB, and VC or the read voltage Vread to be slightly higher (+ shift) when the write loop count has reached a predetermined value. The predetermined value is determined, for example, in the stage of evaluating the memory cell characteristics at the time of the manufacture of the NAND flash memory.

In addition, as the write count of a memory cell increases, the gate insulating film degrades, and the erase speed increases. Hence, if erase voltage application needs to be done, for example, once to set a threshold voltage corresponding to an erase state, ending erase by applying the erase voltage three times means that the memory cell has degraded. If the memory cell in the degraded state is affected by PD, the change amount of the threshold voltage is supposed to be larger.

The memory system according to this embodiment enables correct read by shifting the read levels VA, VB, and VC or the read voltage Vread to be slightly higher (+ shift) when the erase loop count has reached a predetermined value. The predetermined value is determined, for example, in the stage of evaluating the memory cell characteristics at the time of the manufacture of the NAND flash memory.

On the other hand, as the read count increases, the influence of RD adds up, and the amount of electrons injected to an unselected memory cell increases. Some data stored in the NAND flash memory, for example, firmware of the drive control circuit 4 is not updated once it has been written, and only the read operation is performed. Hence, even when the write count is small, the threshold voltage distributions may shift in the + direction when repetitively affected by RD.

The memory system according to this embodiment enables correct read by shifting the read levels VA, VB, and VC or the read voltage Vread to be slightly higher (+ shift) when the read count has reached a predetermined value. The predetermined value is determined, for example, in the stage of evaluating the memory cell characteristics at the time of the manufacture of the NAND flash memory.

Note that even the increase in the read count may cause degradation of the gate insulating film and the increase in the write speed. Hence, a memory cell having a large read count is readily affected by PD and RD as compared to a memory cell having a small read count. Hence, when the read count has reached an arbitrary predetermined value, the read levels VA, VB, and VC or the read voltage Vread may be shifted to be slightly higher. That is, the read count may be used as a factor indicating the degradation of the insulating film, like the rewrite count.

The erase count, the write count, the read count, and the loop count in each block are counted by, for example, the drive control circuit 4, and the count values are written in the management table MT. Note that when the read count is used to estimate the amount of the threshold voltage shift caused by RD, the value is reset after the data in the block is erased or invalidated. This is because data newly written in the block is not affected by RD before the first read. On the other hand, when the read count is used as a factor indicating the degradation of the insulating film, like the rewrite count, the value is continuously held even after the data in the block is erased or invalidated. This is because the degradation of the insulating film is a physical problem unique to the block.

The standing time is set by the system log or the like, as described above. For example, the standing time of data written in each block can be obtained by storing the time data was first written in a memory cell and calculating the difference between the written time and, for example, the current time sent from the host device 1. Alternatively, the standing time may be obtained by the number of times a specific event has occurred in the memory system. For example, a counter that increments every time data in a block of the NAND flash memory is erased is provided. When the count value is stored at the time of data write, an approximate standing time can be estimated by the difference from the current count value. Alternatively, the standing time may be measured by a timer in the memory system.

The ambient temperature is recorded in the management table MT by the drive control circuit 4 based on, for example, the output signal of the temperature sensor 7. For example, the temperature when data is written in a block is recorded in the management table MT. Alternatively, the average temperature in the above-described standing time may be stored at a predetermined timing. When acquiring the ambient temperature, the temperature sensor 7 is preferably provided in proximity to the NAND memory 10.

Figure 10:
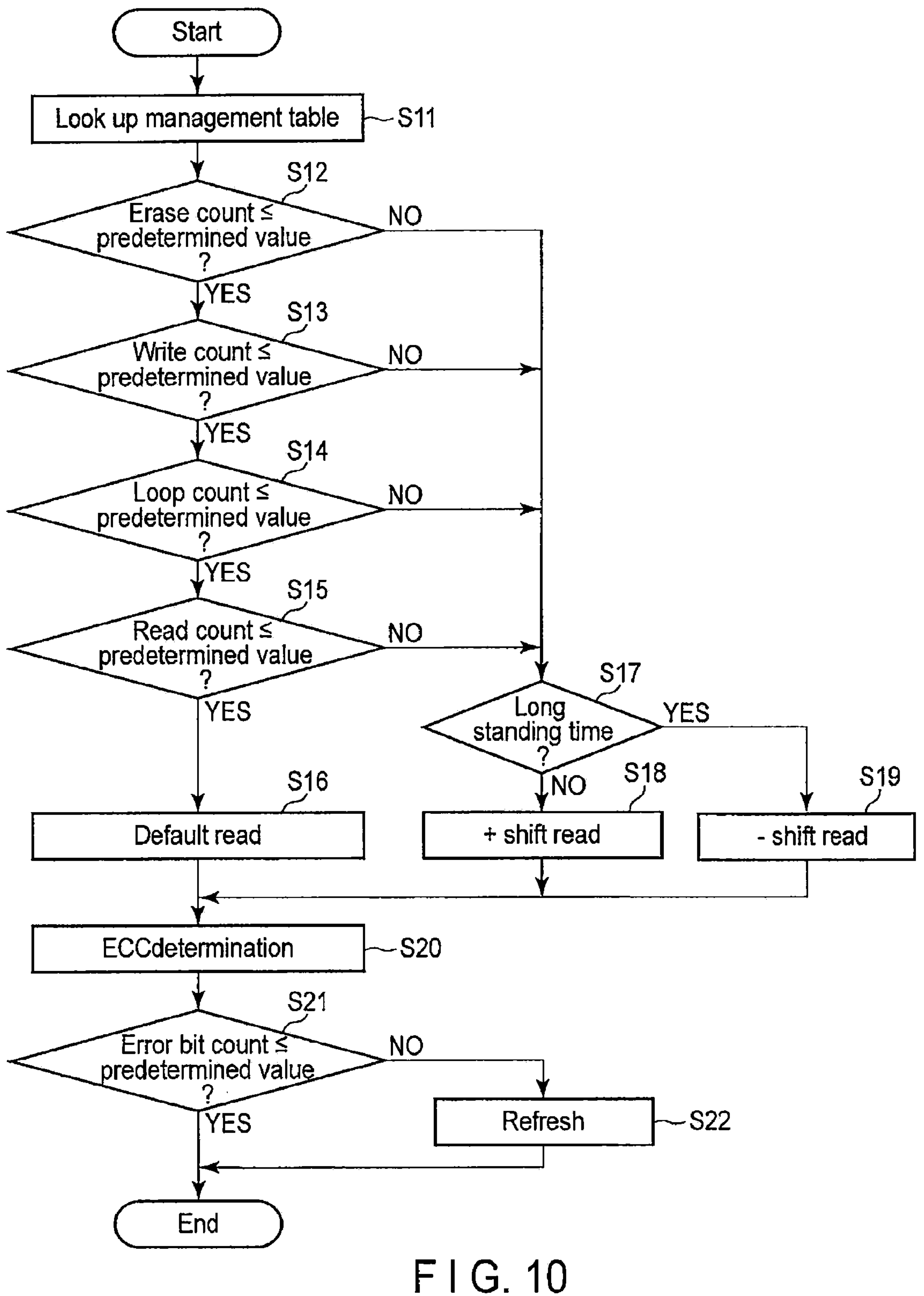
FIG. 10 is a flowchart showing an example of a shift read operation according to the first embodiment.

FIG. 10 shows an example of the shift read operation. Various methods can be employed for the shift read operation, and optimum read is selectively used in accordance with the use environment of the memory system. In other words, not all the steps shown in FIG. 10 need be executed, and only specific steps can be executed in accordance with the use environment of the memory system. The execution order of the steps is merely an example, and the order can be changed in accordance with the use environment of the memory system.

Referring to FIG. 10, the drive control circuit 4 first looks up the management table MT at the time of the shift read operation (step S11). The drive control circuit 4 then determines whether the erase count, the write count, the loop count, and the read count recorded in the management table MT have predetermined values or less (steps S12 to S15). That is, it is determined whether the memory cell is affected by PD and RD. If all the counts have the predetermined values or less, the drive control circuit 4 determines that the memory cell is not affected by PD and RD, and executes the read operation using the default read levels (step S16).

On the other hand, if any one of the erase count, the write count, the loop count, and the read count exceeds the predetermined value, the drive control circuit 4 determines whether the standing time is long (step S17). The standing time is determined using, for example, an arbitrary predetermined time of one day or more using the criterion. If the standing time is short, the influence of PD and RD is supposed to be larger than that of DR. Hence, the read levels VA, VB, and VC and the read voltage Vread are shifted to be higher so as to execute the + shift read operation (step S18). Upon determining in step S17 that the standing time is long, the influence of DR is supposed to be larger than that of PD and RD. Hence, the read levels VA, VB, and VC are shifted to be lower so as to execute the – shift read operation (step S19).

At the time of the + shift read operation or the – shift read operation, the drive control circuit 4 can set the read levels VA, VB, VC, and Vread by the command CMD, the address ADD, and the data DT input to the NAND memory 10. For example, the drive control circuit 4 designates + shift or – shift b by a command and the read levels VA, VB, and VC or the read voltage Vread by an address. In addition, the drive control circuit 4 designates the shift amount by data. The control signal and control voltage generation circuit 207 shown in FIG. 4 generates voltages necessary for the + shift read operation or the – shift read operation based on the command, the address signal, and the data.

Note that the + shift read operation (step S18) or the – shift read operation (step S19) may be executed not once but a plurality of times. When executing each shift read operation a plurality of times, the shift amount in the + direction or the shift amount in the – direction may be changed.

After the read operation, the drive control circuit 4 performs ECC determination (step S20). If the error bit count is larger than a predetermined value, that is, even if the + shift or – shift read operation enables ECC correction of read data, the data read may be impossible in the future shift read operation as long as the error bit count is larger than a predetermined value. Hence, a refresh operation is executed for the block (steps S21 and S22). That is, the data of the read target block is copied to a new erased block.

The erased block of the data copy destination in the refresh operation is preferably a block with a small erase count and a small program count because the degradation of the insulating film is small. The refresh operation can eliminate at least the decrease in the threshold voltage caused by the influence of DR. In this embodiment, however, steps S21 and S22 need not always be executed.

Note that even when, for example, the erase count has the predetermined value or less in step S12, the threshold voltages of the memory cell may have shifted in the − direction if the standing time is long. Hence, even if each count has been determined to have the predetermined value or less in steps S12 to S15, the length of the standing time may be determined using the same criterion as that in step S17 or a different criterion, and default read, + shift read, or − shift read may be executed in accordance with the determination result.

Alternatively, a plurality of levels may be set for the standing time in step S17 such that + shift read is executed when the time does not exceed a first standing time in which the influence of PD and RD and the influence of DR balance, default read is executed when the time ranges from the first standing time (exclusive) to a second standing time (inclusive) in which the threshold voltages are less than the default thresholds, and − shift read is executed when the time exceeds the second standing time.

According to the first embodiment, the read levels VA, VB, and VC and the read voltage Vread are shifted in the + direction or the − direction in consideration of the influence of the program disturb PD, read disturb RD, and data retention DR. For this reason, data can correctly be read independently of the influence of PD, RD, and DR. It is therefore possible to form a reliable memory system.

FIG. 11 shows a modification of the first embodiment and illustrates an example of the management table using status data. For example, upon powering on or at a predetermined timing, the drive control circuit 4 performs monitor read on the page or block basis and records the status at that time in the management table. The monitor read is performed, for example, three times while changing the read levels.

More specifically, the drive control circuit 4 performs, for example, read using the default read levels, read using the read levels shifted to be higher (+ shift), and read using the read levels shifted to be lower (− shift). The ECC error bit count is detected in each read. The read levels for the smallest error bit count are recorded in the management table as status data. As the status data, one of the default read, + shift read, and − shift read is recorded. In actual read, the read levels are set based on the status data stored in the management table. As the shift value at this time, an arbitrary voltage can be set for each rewrite count as described above.

FIG. 12 shows the modification of the first embodiment and illustrates an example of the read operation using status data. In this example, when the read operation starts, the management table MT is looked up (step S11), and the contents of status data are determined (step S23). The management table has, as the status data, for example, the condition that enables read on the page, block, plane, or chip basis. The condition that enables read represents default read, + shift read, − shift read, or the like. If the status data is "default read", the read operation is executed by setting the read levels and the read voltage Vread to the default levels (step S16). For + shift read, the read operation is executed while shifting the read levels VA, VB, and VC and the read voltage Vread to be higher (step S18). If the status data is − shift read, the read operation is executed while shifting the read levels VA, VB, and VC to be lower (step S19).

After the read operation, ECC determination is done as in the example shown in FIG. 10 (step S20). If the error bit count is larger than the predetermined value, a refresh operation is executed for the block (steps S21 and S22). That is, the data of the block is copied to a new erased block.

Even in the modification shown in FIGS. 11 and 12, the read levels VA, VB, and VC and the read voltage Vread are shifted in the + direction or the − direction in consideration of the influence of the program disturb PD, read disturb RD, and data retention DR. Hence, it is possible to correctly read data independently of the influence of PD, RD, and DR.

The shift read operation is not limited to that shown in FIGS. 10-12. For example, the read levels and the read voltage may be changed using temperature data recorded in the management table. For example, to perform read while reducing the influence of PD and RD when the temperature is high, the + shift read operation is executed by shifting the read levels VA, VB, and VC and the read voltage Vread in the + direction. To perform read while reducing the influence of DR, the − shift read operation is executed by shifting the read levels VA, VB, and VC in the − direction. Even this read operation allows to correctly read data independently of the influence of PD, RD, and DR.

Note that when this embodiment is applied to a system capable of neglecting DR, for example, a system that constantly overwrites data at a high speed or a system having a refresh function of updating a block with poor DR (for example, Jpn. Pat. Appln. KOKAI Publication No. 2009-205578 (U.S. application Ser. No. 12/529,282 is based upon and claims the benefit of priority from it)), the necessity for considering the degradation of DR is small. For this reason, the system may be configured to omit shift read in the − direction and perform read only once while shifting the read levels in the + direction (the direction in which the threshold voltages rise).

When this embodiment is applied to a continuously working system such as a server in which the read operation is dominant, the system can be configured to omit the shift read in the + direction and, if the standing time referred to has a predetermined value or more, execute the − shift read operation only once while shifting the read levels VA, VB, and VC in the − direction.

When reading data from a memory cell, it is also effective to read while changing the read time. That is, the read can be performed while canceling the coupling between the memory cells, canceling noise of adjacent bit lines, changing the precharge voltage of the sense node of the memory cell, or changing the number of times of sense or sense time at the time of read.

In this embodiment, the rewrite count is managed for each block using the management table MT. However, the embodiment is not limited to this. For example, when the drive control circuit 4 executes wear leveling processing of actually leveling the rewrite count (erase count or write count) of each block of the NAND memory 10, the necessity of shift read need not always be determined for each block. When the rewrite count of an arbitrary block has reached a predetermined value, the drive control circuit 4 may apply a common condition (default read, + shift read, or − shift read) to all blocks of the NAND memory 10 in the subsequent read operation, assuming that the rewrite count has reached almost the same value in all blocks of the NAND memory 10.

Second Embodiment

The second embodiment will be described next. In the first embodiment, to reduce the influence of PD, RD, and DR, the management table MT is looked up, and the read operation is performed by changing the read levels VA, VB, and VC or the read voltage Vread in the + direction or the – direction. After the read operation, ECC is determined. If the error bit count is large, the block is refreshed.

In the second embodiment, if the error bit count is large, and error correction by ECCs is impossible (ECC error) in the first read, shift read (retry read) is performed. Error correction by ECCs is executed again, thereby improving the percent defective in the system.

FIGS. 13 and 14 illustrate the second embodiment. As shown in FIG. 13, first, data is read from a memory cell using, for example, the default read levels (step S31). It is determined whether ECC correction is possible (step S32). If the error bit count is small, and error correction by ECCs is possible, the read operation ends. If the error bit count is large, and error correction by ECCs is impossible, retry read is executed (step S33).

FIG. 14 shows an example of retry read. In this retry read, first, the read levels are shifted to be, for example, higher than the default read levels so as to perform the + shift read operation (step S41). After that, it is determined whether ECC correction is possible to determine whether error correction can normally be executed (step S42).

If error correction cannot normally be executed, it is determined whether the + shift read operation has been performed a predetermined number of times, for example, twice (step S43). If the number of times is two or less, the + shift read operation is executed again (step S41). At this time, the + shift read operation is performed using read levels higher than those of the preceding time. After that, it is determined whether ECC correction is possible to determine whether error correction can normally be executed (step S42).

If error correction can normally be executed, the retry read ends. If normal execution of error correction is still impossible, it is determined whether the + shift read operation has been performed a predetermined number of times, for example, twice (step S43). In this case, since it is the second + shift read operation, the read level shift direction is reversed.

That is, the read levels are shifted to be, for example, lower than the default read levels so as to perform the – shift read operation (step S44). After that, it is determined whether ECC correction is possible to determine whether error correction can normally be executed (step S45).

If error correction cannot normally be executed, it is determined whether the – shift read operation has been performed a predetermined number of times, for example, twice (step S46). If the number of times is two or less, the – shift read operation is executed again (step S44). At this time, the – shift read operation is performed using read levels lower than those of the preceding time. After that, ECC is determined to determine whether error correction can normally be executed (step S45).

If error correction can normally be executed, the retry read ends. If normal execution of error correction is still impossible, it is determined whether the – shift read operation has been performed a predetermined number of times, for example, twice (step S46). In this case, since it is the second – shift read operation, a drive control circuit 4 determines that data read is impossible even by shift read and returns a status representing an error end of read to a host device 1 (step S47).

In the retry read, the number of times of retry is set to two for both the + direction and the – direction. However, the number of times is not limited to this and may be set to one or three or more for both the + direction and the – direction. In the retry read, the read levels are shifted first in the + direction and then in the – direction. However, the order is not limited to this, and the read levels may be shifted first in the – direction and then in the + direction. Only one of + shift read and – shift read may be executed in accordance with the use environment of the memory system.

In the retry read, the drive control circuit returns a status representing an error end of read in step S47. However, assume that the memory system performs error correction in two steps, as shown in FIG. 3. In this case, a second ECC circuit 118 may determine whether error correction is possible in the ECC correction of steps S32, S42, and S45, and a first ECC circuit 112 may perform error correction in step S47. This reduces the frequency the error correction is activated by the first ECC circuit 112 that consumes large power and takes time in processing.

According to the second embodiment, in data read, if error correction is impossible (ECC error), retry read is performed by shifting the read levels in the + direction or the – direction. This allows to remove the influence of program disturb PD and read disturb RD or the influence of degradation of data retention DR and correctly read data. It is therefore possible to improve the reliability of the memory system.

In the second embodiment, the retry read operation is not limited to the method shown in FIG. 14. The read can also be done while changing the read time. More specifically, for example, an adjacent memory cell prefetch technique is applicable. The prefetch technique is disclosed in Jpn. Pat. Appln. KOKAI Publication No. 2004-326866 (U.S. application Ser. No. 10/601,006 registered as U.S. Pat. No. 6,879,520 is based upon and claims the benefit of priority from it) and Jpn. Pat. Appln. KOKAI Publication No. 2009-70501 (U.S. application Ser. No. 12/209,486 is based upon and claims the benefit of priority from it). The entire contents of them are incorporated herein by reference.

In the prefetch technique disclosed in Jpn. Pat. Appln. KOKAI Publication No. 2004-326866, for example, to read data of a memory cell connected to a word line WLn, data of a memory cell connected to a word line WLn+1 is read first. When read-accessing the memory cell connected to the word line WLn, the read operation is executed while shifting read levels VA, VB, and VC to be slightly higher based on the threshold voltage of the data read from the memory cell connected to the word line WLn+1. This enables to remove the influence of write of the adjacent cell and correctly read data.

In the prefetch technique disclosed in Jpn. Pat. Appln. KOKAI Publication No. 2009-70501, for example, to read data of a memory cell connected to the word line WLn, data of a memory cell connected to the word line WLn+1 is read first. When read-accessing the memory cell connected to the word line WLn, a read voltage Vread to be applied to the unselected word line WLn+1 is shifted to be higher based on the threshold voltage of the data read from the memory cell connected to the word line WLn+1, and the level of the selected word line WLn rises due to coupling. This enables to remove the influence of write of the adjacent cell and correctly read data.

In the above-described adjacent memory cell prefetch techniques, data of a memory cell connected to an unselected word line needs to be read before data of a memory cell connected to a selected word line is read. For this reason, the read is delayed. To cope with this, when the memory system employs a NAND flash memory using the adjacent memory cell prefetch technique, the prefetch technique is selectively used in accordance with the application purpose of the system. For example, the prefetch is turned on in retry read and off in normal read.

In the second embodiment, the sense time in read can be changed. As described above, in a memory cell affected by PD, the threshold voltages are shifted to be higher. For this reason, it is hard for the cell transistor to be turned on by the read voltage Vread. To prevent this, retry read is performed while raising the read voltage Vread to be applied to an unselected word line. In this case, the potential of the selected word line rises due to coupling with the unselected word line. For this reason, a current Icell flowing to the cell transistor connected to the selected word line can be increased. It is therefore possible to correctly read data and improve the reliability of the system.

In the retry read, the precharge voltage of the sense node or the number of times of sense at the time of read can also be changed.

Third Embodiment

FIG. 15 illustrates the third embodiment. In the third embodiment, the read operation combines the first and second embodiments. More specifically, monitor read described in the first embodiment is executed upon powering on or at an arbitrary timing. In the third embodiment, if an ECC error has occurred in the read operation, the read operation is performed while shifting the read levels in both the + direction and the – direction. Status data at that time is recorded in a management table. The next read operation is performed based on the status data recorded in the management table.

As shown in FIG. 15, the read operation is performed using, for example, the default read levels (step S51). After that, it is determined whether ECC correction is possible (step S52). Upon determining that an ECC error has occurred, for example, the read levels are shifted to be slightly higher so as to execute the + shift read operation (step S53). After the read, it is determined again whether ECC correction is possible (step S54). Upon determining that no ECC error has occurred, status data representing + shift is recorded in a management table MT (step S55). In this case, the status data includes, for example, data representing the shift in the + direction and data representing the shift amount.

On the other hand, upon determining in step S54 that an ECC error has occurred, for example, the default read levels are shifted to be slightly lower so as to execute the – shift read operation (step S56). After the read, it is determined whether ECC correction is possible (step S57). Upon determining that no ECC error has occurred, status data representing – shift is recorded in the management table MT (step S58). In this case, the status data includes, for example, data representing the shift in the – direction and data representing the shift amount.

Upon determining in step S57 that an ECC error has occurred, it means that the ECC error cannot be eliminated by shifting the read levels in the + direction (step S53) or the – direction (step S56). Hence, a drive control circuit 4 returns a status representing an error end of read to a host device 1 (step S59). The management table records, for example, data representing that the read target area is unusable.

In this embodiment, each of the shift read in the + direction and the shift read in the – direction is performed once. However, the shift read may be performed a plurality of times, as in the second embodiment. For example, if the ECC error cannot be eliminated by performing + shift read in step S53, ECC determination may be performed again after increasing the shift amount in the + direction. For example, if the ECC error cannot be eliminated by performing – shift read in step S56, ECC determination may be performed again after increasing the shift amount in the – direction.

In addition, ECC determination in step S52 may be performed not to determine whether an ECC error has occurred but to determine whether the error bit count has a predetermined value or less even if error correction is possible. For example, if the error bit count falls within the correctable range but exceeds the predetermined value in step S52, + shift read is executed in step S53. When the ECC determination is performed again in step S54 to reveal that the error bit count is smaller than that in step S52, the + shift amount is recorded in the management table in step S55.

On the other hand, when + shift read is executed in step S53, and the ECC determination is performed again in step S54 to reveal that the error bit count is larger or an ECC error has occurred, – shift read is executed in step S56. When the ECC determination is performed again in step S57 to reveal that the error bit count is smaller than that in step S52, the – shift amount is recorded in the management table in step S58. When – shift read is executed in step S56, and the ECC determination is performed again in step S57 to reveal that the error bit count is larger or an ECC error has occurred, the default read levels are supposed to be optimum. Hence, the default read levels are recorded in the management table. In this case as well, each of the shift read in the + direction and the shift read in the – direction is performed once. However, the shift read may be performed a plurality of times, as in the second embodiment. When the shift read is performed a plurality of times, the error bit count may become larger than that in ECC determination based on the preceding shift amount even without performing the shift a predetermined number of times. In this case, the shift direction may be reversed so as not to perform the shift in the same direction again.

In this way, shift data of the optimum read levels to read the block is recorded in the management table MT. When executing the read operation of this block later, the management table MT is looked up first, as in the first embodiment, to read out the shift data recorded in the management table MT. The read levels are set based on the readout shift data, and the read operation is executed.

According to the third embodiment, when an ECC error has occurred, the read operation is performed by shifting the read levels in both the + direction and the – direction to detect read levels at which no ECC error occurs. Shift data at that time is recorded in the management table MT. The next read operation is performed by setting the read levels based on the shift data recorded in the management table MT. Since data can be read using the read levels optimum for the block, it is possible to correctly read data and improve the reliability of the system.

According to the third embodiment, in the read operation, if an ECC error has occurred, or the error bit count exceeds a predetermined value, the management table is immediately updated. This allows to obtain an immediate effect as compared to the above-described monitor read.

In addition, when reading data of a block, the data can be read using the optimum read levels from the beginning based on the shift data recorded in the management table MT. This makes it possible to increase the read speed and improve the performance as compared to retry read.

Fourth Embodiment

FIG. 16 illustrates the fourth embodiment. The fourth embodiment is applied to a system in which the influence of DR is reduced by a refresh operation. In such a system, the read operation is executed in consideration of the influence of PD and RD.

As shown in FIG. 16, data is read first using the default read levels, and it is determined whether ECC correction is possible (steps S61 and S62). If correction by ECCs is possible, the processing ends. On the other hand, if an ECC error has occurred, the + shift read operation and ECC determination are performed (steps S63 and S64). If correction by ECCs is possible, the processing ends. On the other hand, if an ECC error has occurred, the − shift read operation is executed using levels lower than the default read levels (step S71). After that, ECC determination is performed (step S72). If correction by ECCs is possible, the processing may directly end. However, since it is found that DR has degraded, DR is improved by, for example, performing a refresh operation (step S73). If an ECC error has occurred, an error status is returned to a host device 1. Alternatively, if the drive control circuit can execute error correction in two steps, a first ECC circuit 112 executes, for example, Reed Solomon processing to attempt recovering data.

On the other hand, when the processing ends in a state in which correction by ECCs is possible in step S64, and after that, for example, a command for another read is set (step S65), the + shift read operation is performed using the same shift levels as in step S63 (step S66). After that, ECC determination is performed (step S67). If correction by ECCs is possible, the processing ends. If an ECC error has occurred, the read operation is executed using, for example, the default read levels (step S68). After that, ECC determination is performed (step S69). If correction by ECCs is possible, the processing may directly end. However, since it is found that DR has degraded, DR is improved by, for example, performing a refresh operation (step S70). If an ECC error has occurred, the control advances to step S71.

According to the fourth embodiment, since the number of times of shift read can be decreased in the system in which the influence of DR is reduced, the read operation can speed up. In addition, since necessary shift read is executed, it is possible to perform a correct read operation and improve the reliability of the system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:

a nonvolatile semiconductor memory device including a plurality of memory cells, and a control circuit configured to:

send a first command, to the nonvolatile semiconductor memory device, to read data stored in the memory cells using a first voltage corresponding to a voltage between a first threshold voltage and a second threshold voltage, and send a second command, to the nonvolatile semiconductor memory device, to read the data using a second voltage that is lower than the first voltage and corresponding to the voltage between the first threshold voltage and the second threshold voltage, after a first time has elapsed from a previous access to the memory cells.

2. The memory system of claim 1, wherein the control circuit is configured to send a third command, to the nonvolatile semiconductor memory device, to read the data using a third voltage that is higher than the first voltage, after a second time has elapsed from the previous access to the memory cells, the second time being shorter than the first time.

3. The memory system of claim 1, wherein in a case where an error is detected on data read in a read operation according to the second command, the control circuit is configured to execute a refresh operation on the data read in the read operation according to the second command.

4. The memory system of claim 1, wherein the control circuit is configured to perform an error correction on data read in a read operation according to the second command.

5. The memory system of claim 1, wherein a value of the second voltage vary according to a temperature in the memory system.

6. The memory system of claim 1, wherein in a case where an error is detected on data read in a read operation according to the first command, the control circuit is configured to send a fourth command, to the nonvolatile semiconductor memory device, to read the data using a fourth voltage that is lower than the first voltage.

7. The memory system of claim 1, wherein each of the plurality of memory cells is configured to store data of three or more values.

8. The memory system of claim 1, wherein the nonvolatile semiconductor memory includes a NAND flash memory.

9. The memory system of claim 1, further comprising a memory configured to store a firmware for an operation of the control circuit.

10. The memory system of claim 9, wherein the memory includes a DRAM.

11. A memory system comprising:

a nonvolatile semiconductor memory device including a plurality of memory cells, and a control circuit configured to:

send a first command, to the nonvolatile semiconductor memory device, to read data stored in the memory cells using a first voltage corresponding to a voltage between a first threshold voltage and a second threshold voltage, and send a second command, to the nonvolatile semiconductor memory device, to read the data using a second voltage that is higher than the first voltage and corresponding to the voltage between the first threshold voltage and the second threshold voltage, after a first time has elapsed from a previous access to the memory cells.

12. The memory system of claim 11, wherein in a case where an error is detected on data read in a read operation according to the second command, the control circuit is configured to execute a refresh operation on the data read in the read operation according to the second command.

13. The memory system of claim 11, wherein the control circuit is configured to perform an error correction on data read in a read operation according to the second command.

14. The memory system of claim 11, wherein a value of the second voltage vary according to a temperature in the memory system.

15. The memory system of claim 11, wherein in a case where an error is detected on data read in a read operation according to the first command, the control circuit is configured to send a third command, to the nonvolatile semiconductor memory device, to read the data using a third voltage that is lower than the first voltage.

16. The memory system of claim 11, wherein in a case where an error is detected on data read in a read operation according to the first command, the control circuit is configured to send a fourth command, to the nonvolatile semiconductor memory device, to read the data using a fourth voltage that is higher than the first voltage.

17. The memory system of claim 11, wherein each of the plurality of memory cells is configured to store data of three or more values.

18. The memory system of claim 11, wherein the nonvolatile semiconductor memory includes a NAND flash memory.

19. The memory system of claim 11, further comprising a memory configured to store a firmware for an operation of the control circuit.

20. The memory system of claim 19, wherein the memory includes a DRAM.

* * * * *